(12) United States Patent
Tan et al.

(10) Patent No.: US 7,111,265 B1
(45) Date of Patent: Sep. 19, 2006

(54) I/O PIN PLACEMENT FOR A PROGRAMMABLE LOGIC DEVICE

(75) Inventors: XiangDong Tan, Fremont, CA (US); Xiangyong Wang, San Jose, CA (US); Brent A. Fairbanks, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 39 days.

(21) Appl. No.: 10/353,453

(22) Filed: Jan. 28, 2003

Related U.S. Application Data

(60) Provisional application No. 60/436,256, filed on Dec. 23, 2002.

(51) Int. Cl.
*G06F 17/50* (2006.01)

(52) U.S. Cl. .......................................... 716/10; 716/11

(58) Field of Classification Search .............. 716/7–11, 716/16–18
See application file for complete search history.

(56) References Cited

U.S. PATENT DOCUMENTS 6,289,496 B1 * 9/2001 Anderson et al. ............. 716/16

OTHER PUBLICATIONS

"Using Selectable I/O Standards in Stratix Devices", Altera Corp., Application Note 201, ver. 1.0, Feb. 2002, pp. 1-36.
"Using High-Speed Differential I/O Interfaces in Stratix Devices", Altera Corp., Application Note 202, ver. 1.2, May 2002, pp. 1-11.
"Stratix Programmable Logic Device Family Data Sheet", Preliminary Info., Altera Corp. 2002, pp. 123-132.
"Using the Virtex Select I/O Resource", XILINX Inc., Application Note: Virtex Series, XAPP133 (v2.5) Sep. 7, 2000, pp. 1-10.
Altera Device Data Book, Altera Corp., May 2999, title page, copyright page, pp. 66, 67.
"XC4000XLA/XV Field Programmable Gate Arrays", Product Specification, XILINX Inc., vl.3 Oct. 18, 1999.
J. Anderson, et al., "A Placement Algorithm for FPGA Designs with Multiple I/O Standards", XILINX Inc., FPGA Symposium 2001, pp. 1-14.

* cited by examiner

*Primary Examiner*—Paul Dinh

(57) ABSTRACT

A method and associated computer program product is provided for determining placement of I/O pins on an integrated circuit device. In an exemplary embodiment, a set of pins to be placed is partitioned into pin groups prior to placing individual pins. After partitioning the pins into pin groups, pin groups may, in a preferred embodiment, be ranked according to difficulty of placement. Pins in the most difficult group are placed first by applying a method that, in a preferred embodiment, places pins within the limits imposed by current density requirements while achieving high pin density within those limits when pad resources are relatively limited.

22 Claims, 8 Drawing Sheets

| GROUP | VCCIO | VREF | TERMINATION |
|---|---|---|---|
| A (35 pins) | 1.5V or 1.8V | 0.75V | none |
| B (25 pins) | 1.5V or 1.8V | 0.75V | series |
| C (25 pins) | 2.5V or 3.3V | 1.25V | parallel |
| D (30 pins) | 2.5V or 3.3V | 1.25V | none |

FIG. 3

| Bank | Available pads prior to placing first group of pins to be placed in present placement | Supports pin groups: |
|---|---|---|
| B1 | 20 | A, B |
| B2 | 30 | A |
| B3 | 25 | C, D |
| B4 | 35 | D |
| B5 | 30 | C, D |
| B6 | 20 | A, B |
| B7 | 35 | A |
| B8 | 30 | D |

FIG. 4

I/O PIN PLACEMENT FOR A PROGRAMMABLE LOGIC DEVICE

RELATED APPLICATIONS

This application claims the benefit of U.S. Provisional Application Ser. No. 60/436,256, filed Dec. 23, 2002, and entitled Group-based Initial I/O Pin Placement Algorithm For Programmable Logic Devices With Multiple I/O Standards and Advanced I/O Features.

BACKGROUND OF THE INVENTION

The present invention relates to determining I/O pin placement for programmable logic devices or other similar devices.

Programmable logic devices ("PLDs") (also sometimes referred to as CPLDs, PALs, PLAs, FPLAs, EPLDs, EEPLDs, LCAs, FPGAs, or by other names), are well-known integrated circuits that provide the advantages of fixed integrated circuits with the flexibility of custom integrated circuits. Such devices are well known in the art and typically provide an "off the shelf" device having at least a portion that can be electrically programmed to meet a user's specific needs. Application specific integrated circuits ("ASICs") have traditionally been fixed integrated circuits, however, it is possible to provide an ASIC that has a portion or portions that are programmable; thus, it is possible for an integrated circuit device to have qualities of both an ASIC and a PLD. The term PLD as used herein will be considered broad enough to include such devices.

As PLDs become more complex and flexible, there is an increasing need for the same device to support several different I/O standards. In a typical device, a group of pads sometimes referred to as a "bank" will share a common power source ("$V_{CCIO}$") for driving signals off-chip, a common reference voltage ("$V_{REF}$") for referencing input signals when applicable (not all banks necessarily support use of a reference voltage) and, when applicable, common termination circuitry. Because of the increasing need to support several standards on a single chip, not all I/O banks on will necessarily support the same standard or set of standards. Some standards are not compatible and must be supported on different banks.

Furthermore, the need for an increased density of I/O connections has led to an increased density of pads (i.e., access points where a pin may be placed) on a chip. This increased density of pads causes current density limits to be approached and these current density limits must be accounted for when placing pins at particular pads. Thus, for particular current requirements of particular pins, there may be a limit on how many consecutive pads in a single bank can accommodate such pins. There is a need for an efficient method to maximize pin density within the constraints imposed by current limits.

The need to accommodate multiple I/O standards and to maximize pin density without violating current density limits has made I/O pin placement increasingly difficult. Past methods have treated I/O pins individually for placement purposes and have not addressed current density limits in a manner that adequately maximizes pin density. An improved method is needed to achieve more efficient and effective pin placement.

SUMMARY OF THE INVENTION

The present invention provides an improved method and associated computer program product for determining pin placement in an integrated circuit. In particular, an embodiment of the present invention partitions a set of pins to be placed into pin groups prior to placing individual pins. After partitioning the pins into pin groups, pin groups may, in a preferred embodiment, be ranked according to difficulty of placement. Pins in the most difficult group are placed first by applying a method that, in a preferred embodiment, places pins within the limits imposed by current density requirements while achieving high pin density within those limits when pad resources are relatively limited.

BRIEF DESCRIPTION OF THE DRAWINGS

The novel features of the invention are set forth in the appended claims. However, for purposes of explanation, several aspects of particular embodiments of the invention are described by reference to the following figures.

FIG. 3 is a table illustrating pins groups identified by the partitioning portion of the method illustrated in FIG. 2.

FIG. 4 is a table illustrating the initial pad availability and the pin groups supported for eight exemplary I/O banks such as the I/O banks of the integrated circuit illustrated in FIG. 1.

DETAILED DESCRIPTION OF THE EXEMPLARY EMBODIMENTS

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
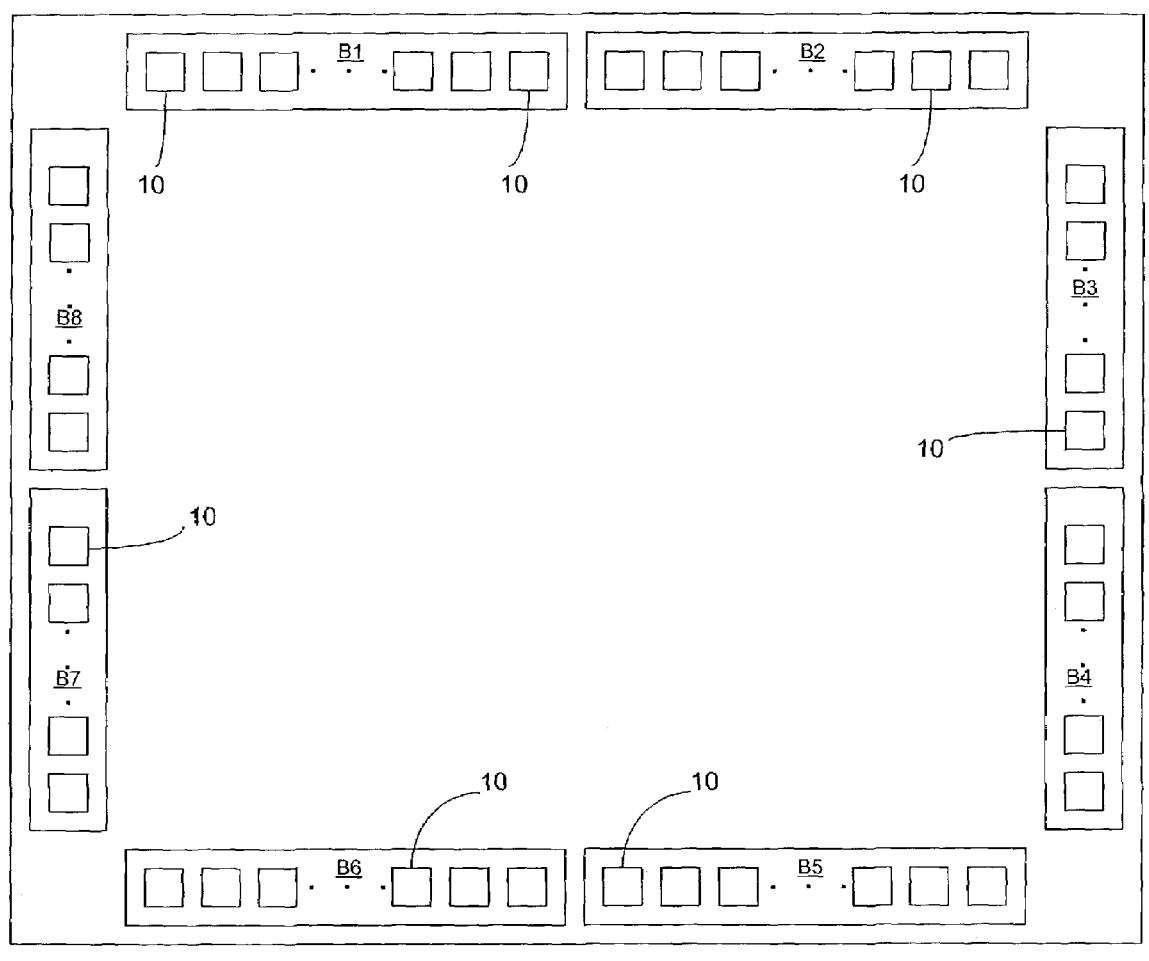
FIG. 1 shows an exemplary integrated circuit in which an embodiment of the present invention may be implemented.

FIG. 1 shows an exemplary integrated circuit 100 in which an embodiment of the present invention may be implemented. Integrated circuit 100 includes I/O pads 10 in which pins may be placed. I/O pads 10 are grouped together in eight I/O banks: B1, B2, B3, B4, B5, B6, B7, and B8. The pads 10 in a particular I/O bank share a common voltage source ("$V_{CCIO}$") with other pads 10 in the same bank. The pads 10 in a particular I/O bank also share a common reference voltage ("$V_{REF}$"), if applicable, with other pads 10 in the same bank. Note that some standards have reference voltages and some do not. Furthermore, the pads 10 in a particular I/O bank share a termination characteristic with other pads 10 in the same bank. For example, a particular bank will have the termination characteristic of either supporting or not supporting termination. Further, banks that do support termination may support a particular type of termination, e.g., series termination or parallel termination.

Figure 2:
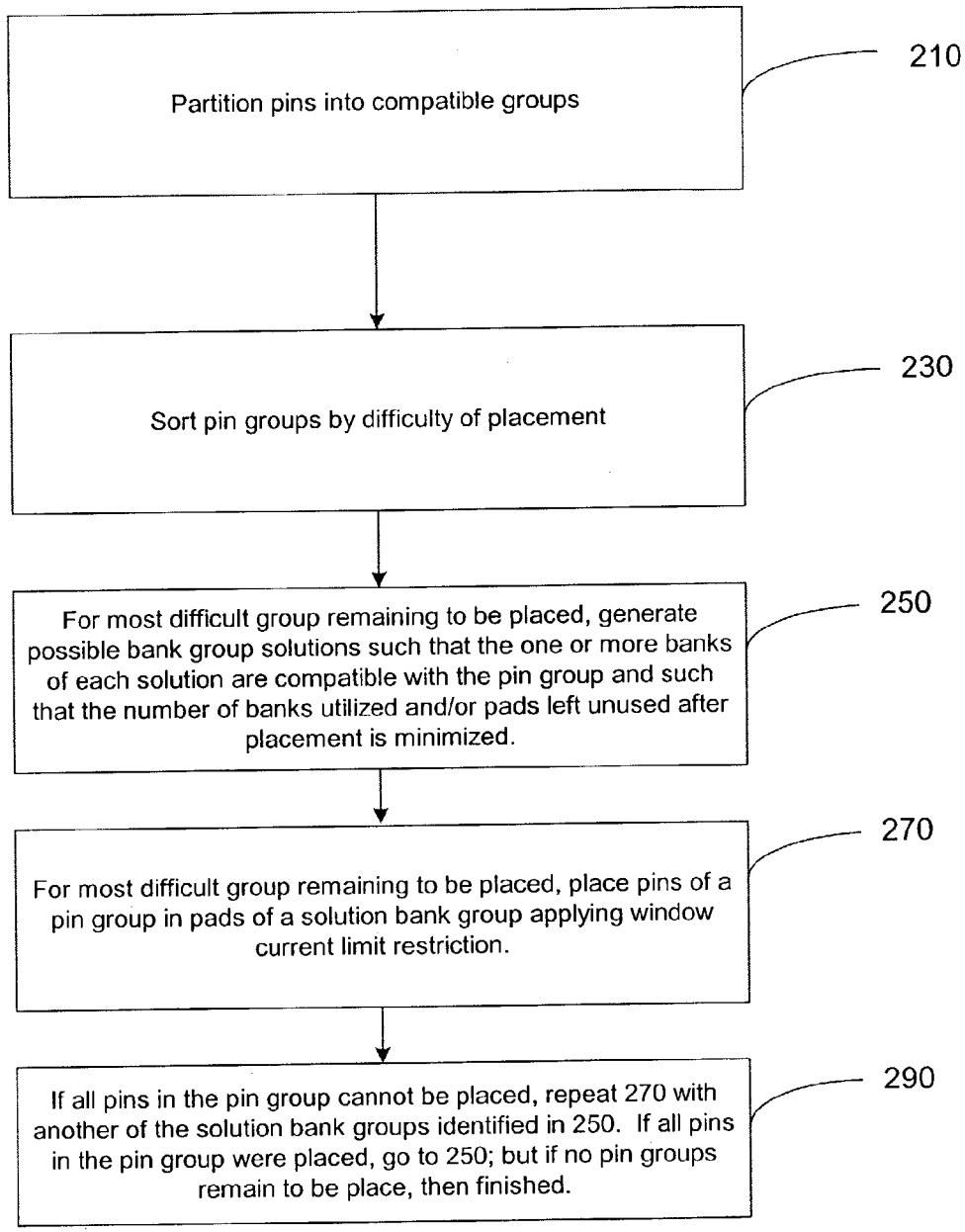
FIG. 2 illustrates a method for placing pins in accordance with an embodiment of the present invention.

FIG. 2 illustrates a method 200 for placing pins in accordance with an embodiment of the present invention. Partitioning 210 comprises partitioning pins into compatible groups. Each group comprises pins that have common requirements with respect to $V_{CCIO}$, $V_{REF}$, and termination such that pins in a pin group may be placed in the same bank or group of banks supporting the requirements of pins in that pin group. Those skilled in the art will appreciate that various I/O standards supported by particular I/O may impose additional requirements that may affect whether or not pins are compatible for placement in the same bank or bank group. For example, a bank may support only single-ended signaling or a bank may also support differential signaling. For purposes of illustrating of the principles of the present inventive pin placement method without unnecessary detail, compatible groups in terms of only certain $V_{CCIO}$, $V_{REF}$, and termination characteristics are shown by way of example in the table of FIG. 3 for a set of pins to be placed partitioned into pin groups A (35 pins), B (25 pins), C (25 pins), and D (30 pins).

In sorting 230, pin groups identified in partitioning 210 are ranked according to difficulty of placement. Sorting 230 is illustrated and described in further detail in FIG. 5 and accompanying text.

In generating 250, beginning with the most difficult pin group identified by sorting 230 that has not yet been placed, up to three possible solutions are generated. A solution identifies the group of one or more banks that support the requirements of the pins in the present pin group and that, as a group of banks, have enough available pads to potentially place all the pins in the pin group. For example, assume banks B1–B8 of integrated circuit 100 illustrated in FIG. 1 have available pads and support pin groups A, B, C, and D as indicated in the table of FIG. 4. Further assuming that sorting 230 identifies pin group C as the most difficult group to be placed, then a set of possible solutions for pin group C that would be identified by generating 250 as follows:

Solution 1: B3
Solution 2: B5
Solution 3: B3, B5

In the exemplary embodiment, Solution 1 would be identified as the best solution. The most preferred solution minimizes the number of banks utilized and/or the number of unused pads that would remain in the bank or banks into which the pin group is placed. Both Solutions 1 and 2 only utilize a single bank. However, bank B3 has fewer available pads than bank B5 (see table in FIG. 4). Thus Solution 1, if it results in successful placement, will minimize the number of unused pads in a bank after placement relative to Solution 2. In placing 270, a solution generated by generating 250 is used to attempt to place the pins of the most difficult pin group remaining to be placed within the constraints imposed by a window current limit of the banks of the utilized solution. For example, in the above case, placing 270 would first attempt to place the pins of group C into bank B3 (the most preferred solution) applying the appropriate window current limit. Further details of placing 270 are illustrated and described in FIG. 6 and accompanying text.

At block 290, if the pins in the relevant pin group were not successfully placed in placing 270, then placing 270 is repeated using another of the possible solutions generated by generating 250. If all pins in the relevant pin group were successfully placed, then at block 290, method 200 is directed to generating 250 to generate possible solutions for the most difficult pin group still remaining to be placed. For example, assuming pin group B is the next most difficult group to be placed, then generating 250 will identify the following solution for pin group B:

Solution 1: B1, B6.

Banks B1 and B6 are the only banks that support group B, but because each bank only has 20 available pads, both banks will be required. Thus, the only possible solution is B1, B6.

The table in FIG. 4 shows pads available in each bank only prior to beginning the present placement of pins. As method 200 progresses, the available pads in a particular bank may decrease for easier to place groups and thus affect the possible solutions. For example, continuing the above hypothetical placement, assuming that placing pin group C consumed fifteen pads in bank B3 and ten pads in bank B5, those banks will now have, respectively, ten and twenty pads available to place the next group. Further assuming the next most difficult group to place is group D, possible solutions for pin group D include the following:

Solution 1: B3, B4
Solution 2: B3, B8
Solution 3: B4, B5

Note that because, in the present example, the placement of group C reduced the available pads in banks B3 and B5, the bank group B3, B5 is no longer a possible solution for pin group D.

Although other possible solutions exist for pin group D, (e.g., B4, B8), a preferred embodiment of the invention does not indicate generating more than three possible solutions. However, one skilled in the art will appreciate that more or fewer solutions might be generated without necessarily departing from the spirit and scope of the present invention.

Generating 250 and placing 270 are repeated until all pin groups (in this example, pin groups A, B, C, and D) are placed. As indicated at block 290, once all groups are placed, then placement of the present set of pins to be placed is finished.

Figure 5:
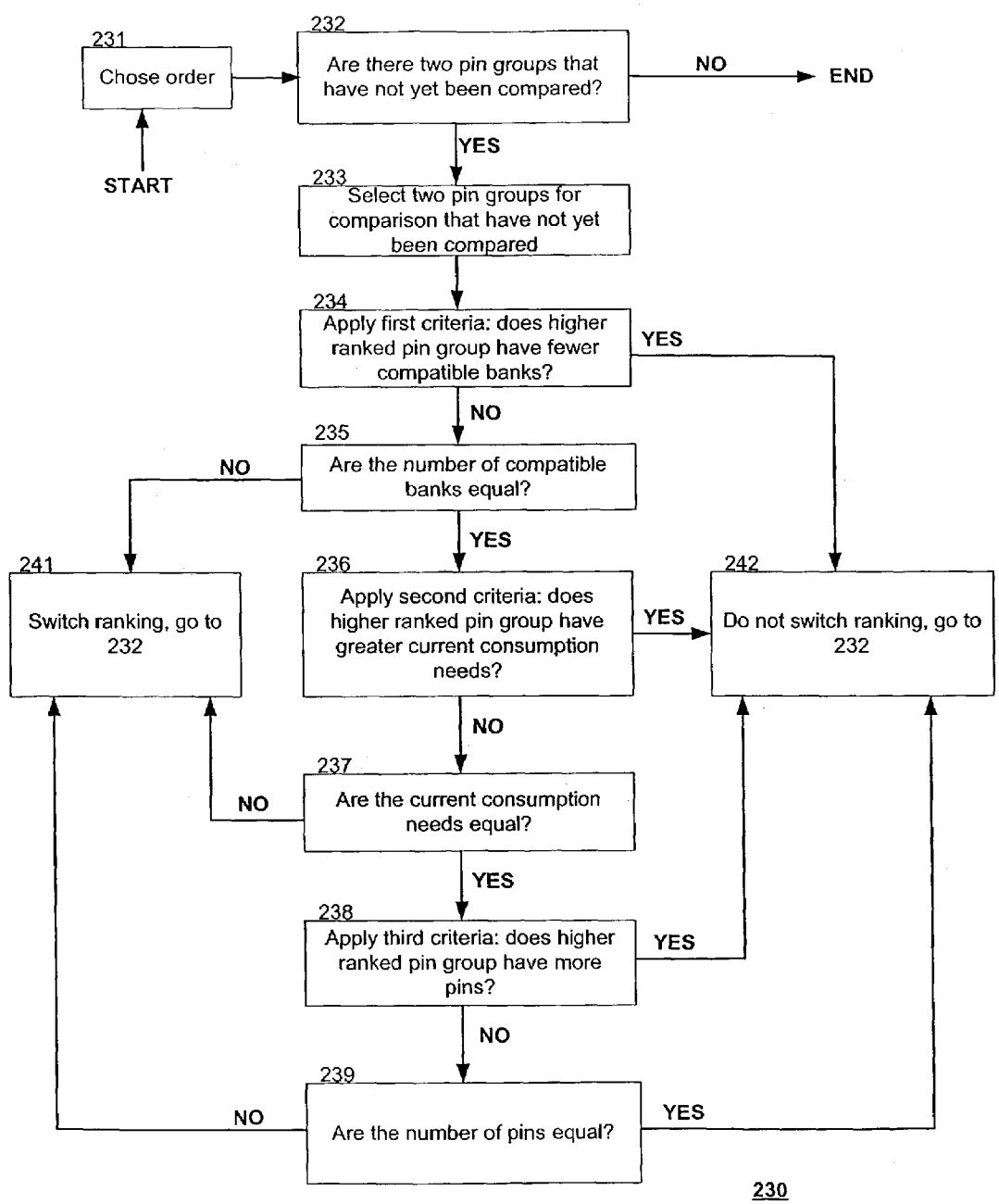
FIG. 5 is a flow diagram illustrating the process carried out in the sorting portion of the method illustrated in FIG. 2.

FIG. 5 is a flow diagram illustrating details of sorting 230. Sorting 230 utilizes the known sorting technique of beginning with an ordered set of items, then comparing pairs of that order set using prescribed criteria, and switching the ranking of items if necessary until all necessary pairs have been compared. In sorting 230, the primary comparison criteria utilized is the number of compatible banks for the pin groups being compared (block 234). The secondary comparison criteria utilized is the current requirement for the pins groups being compared (block 236). The tertiary criteria is the number of pins in the pin groups being compared (block 238). Those skilled in the art will appreciate that in alternative embodiments, more or less criteria may be applied in sorting the pin groups without necessarily departing from the scope of the invention. Also, the priority of the criteria may modified in alternative embodiments depending upon the context in which the method is applied.

Considering FIG. 5 in further detail, the process illustrated begins at block 231 with choosing an initial order. The manner of choosing the initial order is not important. The initial order might be chosen randomly or based upon some arbitrary criteria. For example, in the context of the set of pin groups A, B, C, and D, the initial order might be chosen alphabetically. In this case, the initial order would rank A as the most difficult group, followed by, respectively, B, C, and D. At block 232, it is determined whether two pin groups exist that have not yet been compared. At the beginning of the process, no groups have been compared, so the method will proceed to block 233 where two pin groups are selected for comparison. It does not matter which groups are selected as long as the two groups selected have not yet been compared. For example, assume groups A and B are the groups first selected for comparison. At block 234, the first criteria is applied. Specifically, at block 234, it is determined whether group A (ranked higher than B by the initial ordering at block 231) has fewer compatible banks than group B. It is presumed that having fewer compatible banks makes a pin group more difficult to place and therefore that pin group should be ranked higher. If the higher ranked pin group does have fewer compatible banks, then the method proceeds to block 242, the rank is not switched, and the method returns to block 232 to determine if additional pin groups exists that have not yet been compared. In the present example, however, group A does not have fewer compatible pin groups than group B (group A is supported by banks B1, B2, B6, and B7 whereas group B is only supported by banks B1 and B6), therefore the process proceeds to block 235. At block 235, it is determined whether groups A and B have the same number of compatible banks. If the answer is "YES," the method proceeds to block 236 to apply the second criteria regarding current consumption. However, in the present example, the answer at block 235 is "NO" because pin group A is supported by four banks and pin group B is only supported by two banks. Thus the method proceeds to block 241 where the ranking of A and B are switched and the method returns to block 232 to determine whether additional pin groups exist that have not yet been compared.

Continuing the present example, assume that the next execution of block 233 selects pin groups B and C for comparison. Because groups B and C both have two compatible banks (pin group B is supported by banks B1 and B6 and pin group C is supported by banks B3 and B5), the method will proceed from block 234 through block 235 and then to block 236 where the criteria of current consumption is applied. It is presumed that higher current consumption requirements imply a greater difficulty of placement for a pin group due to the current density limits illustrated and discussed in greater detail in FIG. 6 and accompanying text. Applying the current requirement criteria of block 236 to a comparison of pin groups B and C indicates that the higher ranked group does not have greater consumption needs. Note that the initial ranking placed B ahead of C; however, because pin group C has parallel rather than series termination, and because group C operates at a higher voltage, it would be expected that group C has greater current requirements than group B. Thus the determination at blocks 236 and 237 is "NO" and sorting 230 proceeds to block 241 which indicates that the ranking of B and C should be switched. Sorting 230 next proceeds back to block 232 to determine whether any two pin groups remain that have not yet been compared.

If block 237 indicates that the current consumption needs are equal, then sorting 230 proceeds to block 238 to apply the third criteria determining whether the higher ranked group has more pins than the lower ranked group. It is presumed that, other factors being equal, a pin group with more pins will be more difficult to place than a group with fewer pins. Thus, if the higher ranked group does have more pins, sorting 230 proceeds to block 242 where the ranking is not switched, and the method then returns to block 232 to determine whether any groups remain to be compared. If the result of block 238 is "NO", then at block 239 it is determined whether the number of pins in each group is equal. If the result of block 239 is "NO", then the ranking is switched at block 241 and sorting 230 proceeds back to block 232. If the result of block 239 is "YES," then the ranking is not switched as indicated by block 242 and sorting proceeds back to block 232.

To cite just one example how the sorting process illustrated in FIG. 5 might be modified, if the third criteria of the number of pins in the pin group were not utilized, then blocks 238 and 239 would be eliminated and a "YES" result at block 237 would direct the process to block 242 indicating the ranking should not be switched. The sorting process would then proceed back to block 232 to determine if any remaining pin groups needed to be compared.

Once all groups have been compared, then the result of block 232 will be "NO" and ordering of groups by difficulty of placement as determined by block 210 is complete.

Figure 6:
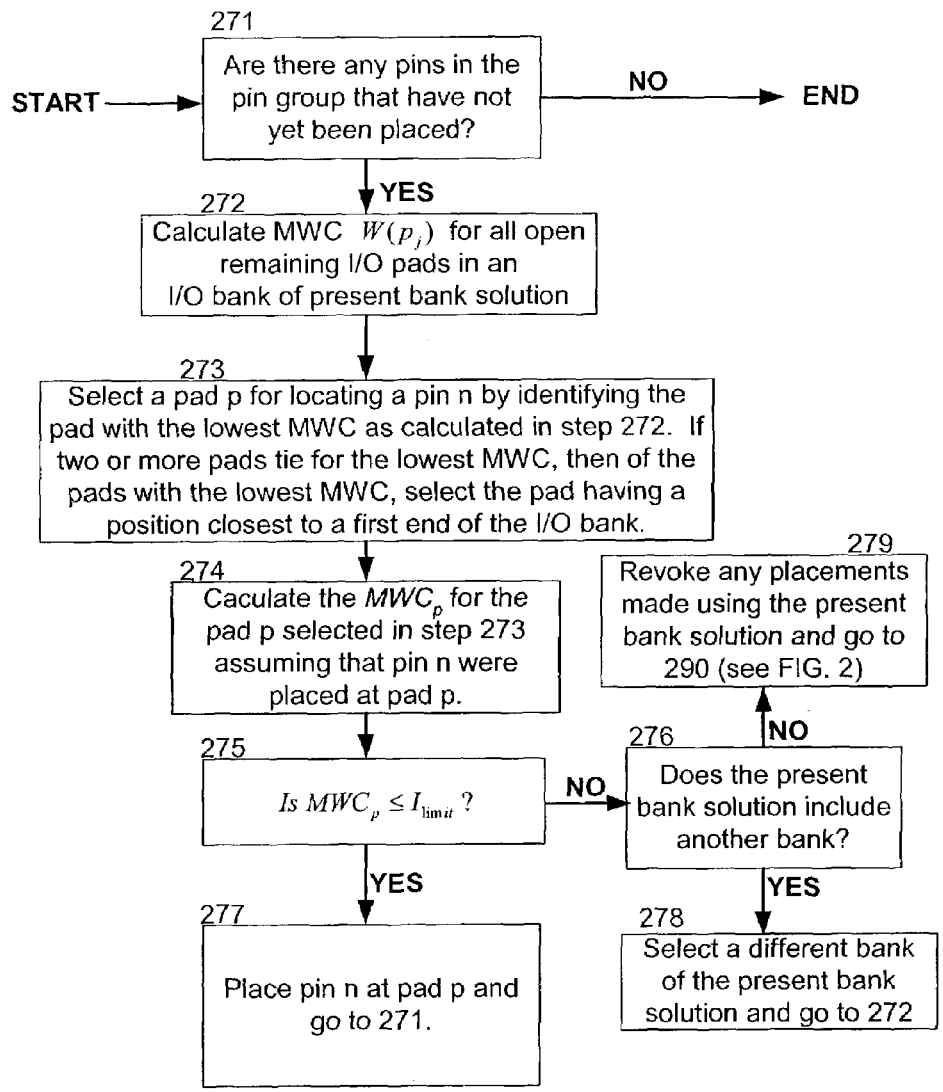
FIG. 6 is a flow diagram illustrating the process carried out in the placing portion of the method illustrated in FIG. 2.

FIG. 6 is a flow diagram illustrating placing 270 of the embodiment illustrated in FIG. 2. Placing 270, as illustrated in FIG. 6, places pins of a particular group in one or more compatible banks within the requirements imposed by a current density limit.

The flow diagram of FIG. 6 will be described using an example of placing an exemplary group of fourteen pins into an exemplary I/O bank 70 as illustrated in FIGS. 7a–7e. For purposes of this example, assume that the maximum current density allowed for I/O bank 70 is 200 mA for every ten consecutive I/O pads. This may be expressed as: $I_{limit}=200$ mA. Further assume the exemplary group of fourteen pins being placed has a current requirement of 40 mA for each pin.

Figure 7A:
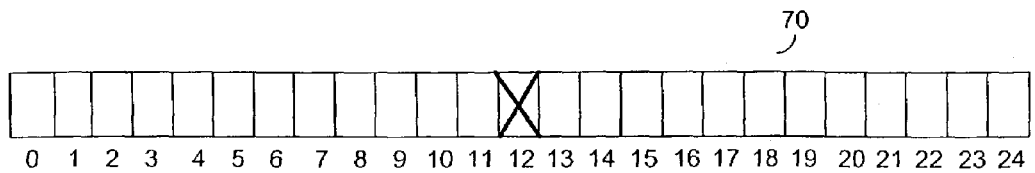
FIGS. 7a–7d illustrates exemplary progressive pin placement states of an I/O bank in which the placing process of FIG. 6 is carried out.
Figure 7B:
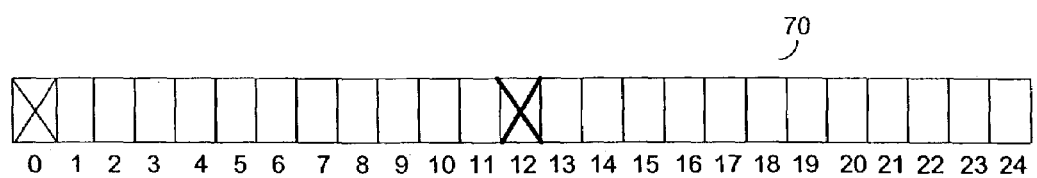

Referring to FIG. 7a, bank 70 has twenty-five I/O pads, numbered 0–24. It will be assumed that prior to placing the exemplary group of fourteen I/O pins, pad 12 is already occupied by a dedicated pin indicated by the bold X symbol. For purposes of this example, it is assumed that the dedicated pin already occupying pad 12, like the pins of the exemplary group of fourteen pins to be placed, also requires 40 mA of current.

Referring to FIG. 6, the process for placing the exemplary pin group begins at block 271. At block 271, it is determined whether any pins in the group remain to be placed. Assuming at least some pins in the group have not yet been placed, placing 270 proceeds to block 272. At block 272, the maximum window current (MWC) $W(p_j)$ is calculated for each available pad in a bank of the present bank solution; in this example, the only bank of the present bank solution is bank 70. The MWC is defined by the following equation:

$$MWC\ W(p_j) = \max_{k=j-9}^{j} \left( \sum_{i=k}^{k+9} I(p_i) \right) \quad (1)$$

Applying equation (1) to a particular pad p requires summing the current that would presently be consumed at each "window" of ten pads that might include pad p and then taking the maximum of those summations. For example, the individual summations performed in applying equation (1) to pad 5 of bank 70, assuming the presence of pins shown in FIG. 7a, yields the following possible windows and corresponding currents:

| WINDOW (ten consecutive pads including pad 5) | CURRENT |
| --- | --- |
| 0-9 | 0 mA |
| 1-10 | 0 mA |
| 2-11 | 0 mA |
| 3-12 | 40 mA |
| 4-12 | 40 mA |
| 5-13 | 40 mA |

Selecting the maximum from the above window currents yields the result of 40 mA. Thus, for pad 5 in FIG. 7a, $$MWC\ W(p_j) = \max_{k=j-9}^{j}\left(\sum_{i=k}^{k+9} I(p_i)\right) = 40\ \text{mA}.$$

(Note that pads closer to the middle of bank 70 would fall within a greater number of ten-pad windows. For example, while pad 5 falls within only in six different ten-pad windows, pad 11 falls within ten different ten-pad windows).

Applying equation (1) to calculate the MWC for all of the available pads in bank 70 illustrated in FIG. 7a yields the following results: Each of pads 0, 1, 2, 22, 23, and 24 have a MWC of 0 mA and the remaining available pads (pads 3–11 and 13–21) have a MWC of 40 mA.

At block 273, a pad p is selected for placing a pin n from the group of pins to be placed. Pad p is determined by selecting the pad with the lowest MWC as calculated at block 272. Continuing the example of placing a first pin n from the exemplary group of fourteen pins requiring 40 mA each, recall that block 272 applied to the pads in the state illustrated in FIG. 7a would yield six pads with a MWC 0 mA (pads 0, 1, 2, 22, 23, and 24). As indicated by block 273, in the case of a tie for the lowest MWC, the tie is broken by selecting the pad closest to a first end of bank 70. In this example, the "first end" is designated as the end at pad 0. Those skilled in the art will recognize that the "first end" could also have been designated as the end at pad 24. Assuming the first end is the end at pad 0, then the tie is broken by selecting pad 0 for placing pin n.

At block 274, the MWC is calculated for the selected pad p assuming pin n is placed at that pad. In this example, pin n requires 40 mA. Reapplying equation (1) to pad 0, assuming a pin n requires 40 mA, yields a new MWC for pad 0 of 40 mA.

At block 275, it is determined whether the MWC for pad p after a pin n is placed at pad p is less than the window current limit. This may be expressed by the following statement:

$$MWC \leq I_{limit}? \qquad (2)$$

As indicated previously, for the present example, it is assumed that the window current limit for a ten-pad window in bank 70 is 200 mA. Thus, applying equation (2) to the placement of a first pin n at pad 0 yields the result "YES."

Continuing with the present example, assuming the result of block 275 is "YES," the pin n is placed at pad p (in this case, pad 0), and, as indicated by block 277, placing 270 returns to block 271. It is understood that, in the context of a computer program carrying out an exemplary method in accordance with the present invention to determine where pins should be placed, stating that a pin n "is placed" at pad p does not necessarily imply final physical placement of an actual pin on the integrated circuit; rather, "placed" simply refers to designation of placement of a particular pin at a particular pad. In other words, a system performing the illustrated method would designate that a pin n is placed at pad p.

Referring again to block 271, because only one pin has thus far been placed from the exemplary group of fourteen pins (a pin at pad 0), the result of block 271 will again be "YES" and placing 270 will proceed again to block 272. At block 272, the MWC will again be calculated for all remaining available pads. After the placement of a first pin n at pad 0, the state of bank 70 is now represented by FIG. 7b. Applying equation (1) to the available pads of FIG. 7b yields the following result: pads 1–11 and 13–21 have a MWC of 40 mA and pads 22, 23, and 24 have a MWC of 0 mA.

At block 273, a pad p is selected for locating the next pin n by again selecting the pad determined at block 272 to have the lowest MWC, and breaking any ties by selecting the pad closest to the first end (at pad 0). Applying block 273 to the results of block 272 for the pads of FIG. 7b results in selection of pad 22 for placing the next pin n.

Figure 7C:
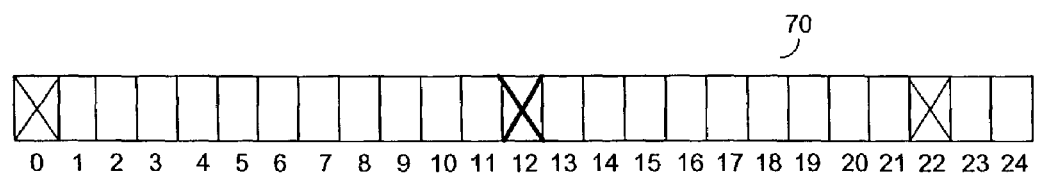

At block 274, the MWC for the selected pad (pad 22 in this example) is recalculated assuming placement of a pin n requiring 40 mA at that pad. At block 275, equation (2) is applied to placement of the pin n at pad 22. In this example, the result of this application of block 275 is "Yes", thus the pin is placed at pad 22 and the process returns to block 271. FIG. 7c shows the state of the pads of bank 70 after the placement of a pin n at pad 22. Note that the next application of block 272 (to the pads of bank 70 in the state illustrated in FIG. 7c) will yield the following result: available pads 1–11, 13–21, and 23–24 will all have a MWC of 40 mA. Thus application of blocks 273–274 will result in the next pin n being placed at pad 1.

Placing 270 continues until either block 275 or block 271 results in "NO." If block 275 results in "NO" for any pin, then placing 270 proceeds to block 276. At block 276 it is determined whether the present bank solution includes another bank. If the result of block 276 is "YES", then a different bank of the present bank solution is selected as indicated by block 278 and placing 270 returns to block 272 (in this case, blocks 272 and subsequent blocks will be executed with respect to the different bank chosen at block 278). If the result of block 276 is "NO", then the present group of pins cannot be placed using the present bank solution and any placements made using the present bank solution are revoked. Placing 270 would then exit to block 290 of method 200 (see FIG. 2) which then restarts placing 270 using a different bank solution generated by generating 250 (see FIG. 2). Thus, even though some pins in the group may have been "placed" (i.e., assumed to be placed) in particular pads of the present bank solution, if the result of block 276 is "NO", those placements will be disregarded and the entire group of pins will be attempted to be placed in another bank solution.

Once all pins in the pin group have been placed, the result of block 271 is "NO," and 270 is finished.

Figure 7D:
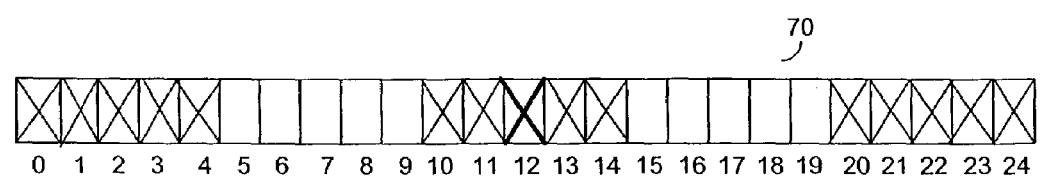

In the present example, all fourteen pins in the exemplary group can be placed in bank 70 without violating the current limit. FIG. 7d shows the placement that results from applying process 270 to the placement of the exemplary group of fourteen 40 mA pins in bank 70 assuming a current window limit of 200 mA (where the window is ten pads).

Figure 7E:
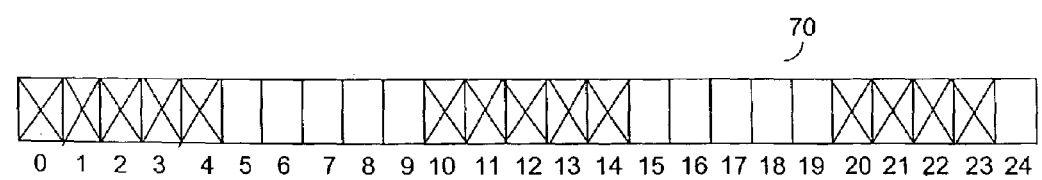
FIG. 7e illustrates another example of pin placements resulting from the process illustrated in FIG. 6.

FIG. 7e shows the placement of pins that would result if bank 70 did not have a pre-existing pin placement at pad 12 prior to placement of the exemplary pin group comprising fourteen pins. This placement also assumes a current window limit of 200 mA where the window is ten pads.

The window size of ten pads is only exemplary of a context where it is useful or convenient to rely on a current density limit that is expressed in current per ten pads. For example, to cite but one possible alternative example, in another context it might useful or convenient for current density limits to be considered with respect to a limit of total current for five consecutive pads. In such an example, the window size chosen might be five pads rather then ten. If the window used to determine maximum window current were five pads, the equation for MWC would be as follows:

$$MWC\ W(p_j) = \max_{k=j-4}^{j}\left(\sum_{i=k}^{k+4} I(p_i)\right) \quad (1)\ (modified)$$

Figure 8:
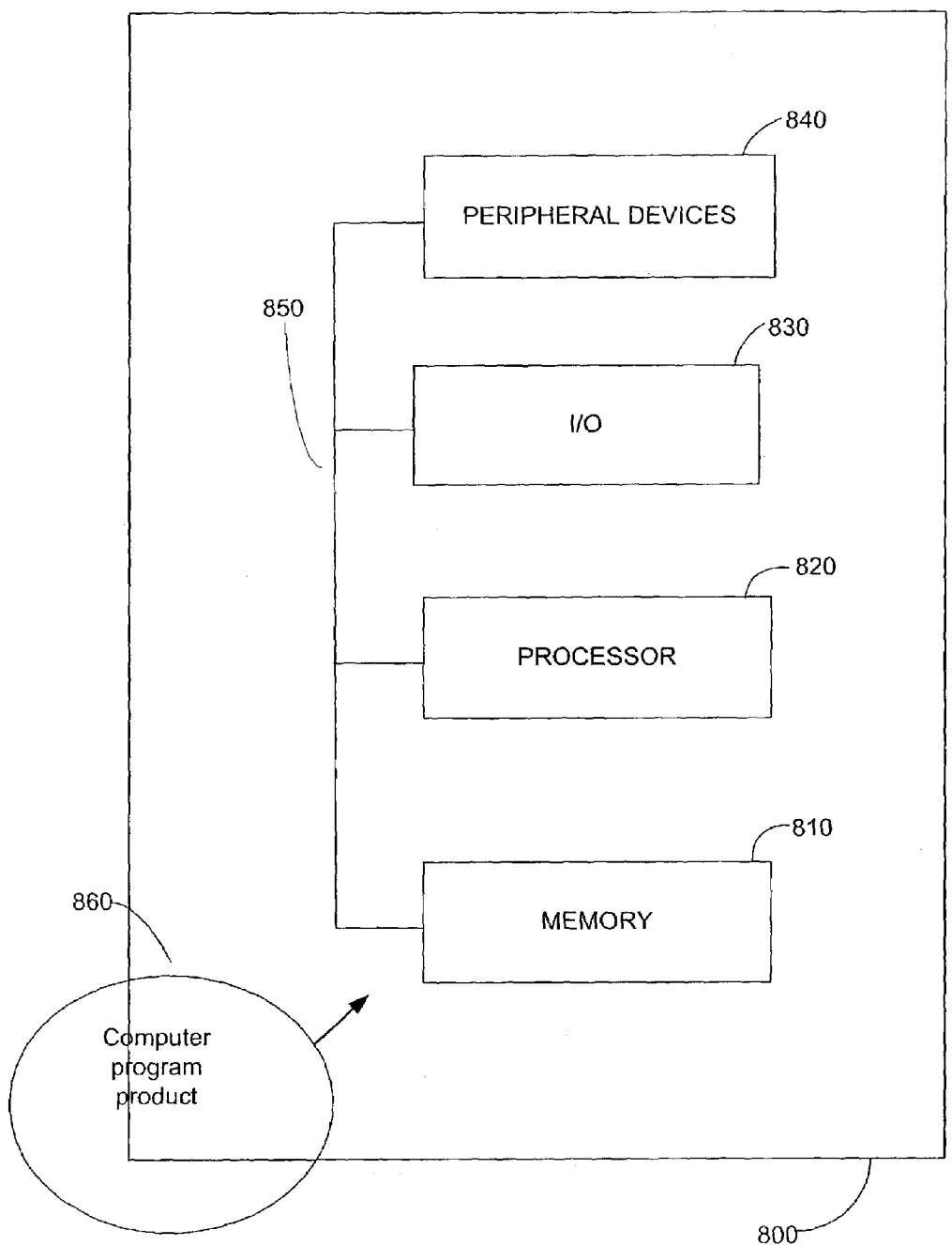
FIG. 8 illustrates a computer system which may execute instructions contained in a computer program product in accordance with an embodiment of the present invention.

FIG. 8 shows an example of a computer system 800 that may be used to execute instruction code contained in a computer program product 860 in accordance with an embodiment of the present invention. Computer program product 860 comprises executable code in an electronically readable medium that may instruct one or more computers such as computer system 800 to perform processing that accomplishes the exemplary method of FIGS. 2, 5, and 6. The electronically readable medium may be any medium that either stores or carries electronic signals (including signals referred to as electrical signals and signals referred to as electromagnetic signals) and may be accessed locally or remotely, for example via a network connection. The executable instruction code in an electronically readable medium directs the illustrated computer system 800 to carry out various exemplary tasks described herein. The executable code for directing the carrying out of tasks described herein would be typically realized in software. However, it will be appreciated by those skilled in the art, that computers might utilize code realized in hardware to perform many or all of the identified tasks without departing from the present invention. Those skilled in the art will understand that many variations on executable code may be found that implement exemplary methods within the spirit and the scope of the present invention.

The code or a copy of the code contained in computer program product 860 may be stored in memory 810 for execution by processor 820. Computer system 800 also includes I/O subsystem 830 and peripheral devices 840. I/O subsystem 830, peripheral devices 840, processor 820, and memory 810 are coupled via bus 850.

Those skilled in the art will appreciate computer system 800 illustrates just one example of a system in which a computer program product in accordance with an embodiment of the present invention may be implemented. To cite but one example of an alternative embodiment, execution of instructions contained in a computer program product in accordance with an embodiment of the present invention may be distributed over multiple computers, such as, for example, over the computers of a distributed computing network.

Although particular embodiments have been described in detail, various modifications to the embodiments described herein may be made without departing from the spirit and scope of the present invention, thus, the invention is limited only by the appended claims.

We claim:

1. An I/O pin placement method for locating a plurality of I/O pins on an integrated circuit, the method comprising:
    (a) partitioning the pins into a plurality of pin groups, pins in a pin group being compatible with other pins in the same group under prescribed criteria relating to characteristics of an I/O bank group comprising one or more I/O banks such tat the pins in the pin group are operable to be placed in the I/O bank group without violating the prescribed criteria;
    (b) for a first pin group of the plurality of pin groups, generating at least one possible bank solution, a bank solution identifying one or more banks that can accommodate all the pins in the first group without violating the prescribed criteria;
    (c) for a first bank solution of the at least one possible bank solution, placing pins of the first pin group in the one or more banks identified by the first bank solution consistent wit a maximum window current restriction for pads in the one or more banks of the first bank solution; and
    (d) repeating (b) and (c) for respective other groups of the plurality of pin groups.

2. The method of claim 1 wherein if pins of a pin group being placed cannot be placed using the first bank solution and if the at least one possible bank solution includes at least one other bank solution, repeating (b), (c), and (d) for the pin group being placed using a bank solution of the at least one other bank solution.

3. The method of claim 1 wherein one of the prescribed criteria includes source voltage requirements.

4. The method of claim 3 wherein one of the prescribed criteria includes reference voltage requirements.

5. The method of claim 3 wherein one of the prescribed criteria includes termination requirements.

6. The method of claim 1, further comprising:
    sorting the pin groups resulting from (a) according to difficulty of placement wherein the first group of the plurality of pin groups has the highest difficulty of placement and the subsequent groups of the plurality of pin groups respectively have decreasing difficulty of placement.

7. The method of claim 6 wherein sorting includes applying as a ranking criteria the number of banks compatible with a corresponding pin group, a smaller number of compatible banks indicating a greater degree of difficulty of placement for the corresponding pin group.

8. The method of claim 6 wherein sorting includes applying as a ranking criteria the amount of amount of current required by pins in a pin group, a greater current requirement indicating a greater degree of difficulty of placement.

9. The method of claim 1 wherein generating comprises identifying preferred bank solutions and a preferred order of bank solutions and wherein the first bank solution is a solution in which the number of banks is minimized.

10. The method of claim 1 wherein generating comprises identifying preferred solutions and a preferred order of solutions and wherein the first solution is a solution in which a number of unused pad in the one or more banks of the bank solution, if placement is successful, is minimized.

11. The method of claim 1 wherein the at least one possible bank solution comprises a maximum of three possible bank solutions.

12. The method of claim 1 wherein placing comprises:
    (i) calculating a maximum window current for each available pad in a bank of the one or more banks of the first bank solution;

(ii) of the available pads, identifying a pad p having the lowest maximum window current if only one pad has the lowest maximum window current;

(iii) if more than one pad has the lowest maximum window current, identifying a pad p of the pads having the lowest maximum window current that is positioned closest to a fit end of the pad p's I/O bank;

(iv) calculating a maximum window current for the pad p (MWCp) assuring a pin n form a pin group presently being placed is placed at pad p;

(v) designating pin n as placed at pad p if MWCp is not greater than a window current limit corresponding to pad p's I/O bank; and (vi) if pins remains remain unplaced in the pin group presently being placed, repeating (i)–(v).

13. The method of claim 12 wherein if (v) indicates that MWCp is greater than the window current limit, and if the first bank solution used does not include another bank, placing is repeated using another solution of the at least one possible bank solution.

14. The method of claim 12 wherein if (V) indicates that MWCp is greater than the window current limit, and if the first bank solution includes another bank, placing is continued using another bank of the first bank solution.

15. The method of claim 1 wherein the integrated circuit is a programmable logic device.

16. The method of claim 12 wherein the integrated circuit is a programmable logic device.

17. A computer program product for locating a plurality of I/O pins on an integrated circuit, the computer program product comprising executable instruction code in an electronically readable medium for at least:

(a) partitioning the pins into a plurality of pin groups, pins in a pin group being compatible with other pins in the same group under prescribed criteria relating to characteristics of an I/O bank group comprising one or more I/O banks such that the pins in the pin group are operable to be placed in the I/O bank group without violating the prescribed criteria;

(b) for a first pin group of the plurality of pin groups, generating at least one possible bank solution, a bank solution identifying one or more banks that can accommodate all the pins in the first group without violating the prescribed criteria;

(c) for a first bank solution of the at least one possible bank solution, placing pins of the first pin group in the one or more banks identified by the first bank solution consistent wit a maximum window current restriction for pads in the one or more banks of the of bank solution; and (d) repeating (b) and (c) for respective other groups of the plurality of pin groups.

18. The computer program product of claim 17 wherein the executable instruction code in an electronically readable medium is also at least for plain pins of a pin group by at least:

(i) calculating a maximum window current for each available pad in a bank of the one or more banks of the first bank solution;

(ii) of the available pads, identifying a pad p having the lowest maximum window current if only one pad has the lowest maximum window current;

(iii) if more than one pad has the lowest maximum window current, identifying a pad p of the pads having the lowest maximum window current that is positioned closest to a first end of the pad p's I/O bank;

(iv) calculating a maximum window current for the pad p (MWCp) assuming a pin n from a pin group presently being placed is placed at pad p;

(v) designating pin n as placed in pad p if MWCp is not greater than a window current limit corresponding to pad p's I/O bank; and (vi) if pins remains remain unplaced in the pin group presently being placed, repeating (i)–(v).

19. The computer program product of claim 18 wherein the executable instruction code in an electronically readable medium is also for at least:

if (v) indicates that MWCp is greater than the window current limit, and if the first bank solution used does not include another bank, repeating placing using another solution of the at least one possible bank solution.

20. The computer program product of claim 18 wherein the executable instruction code in an electronically readable medium is also for at least:

if (v) indicates that MWCp is greater than the window current limit, and if the first bank solution includes another bank, continuing placing using another bank of the first bank solution.

21. An I/O pin placement method for locating a plurality of I/O pins on an integrated circuit, the method comprising:

(a) steps for partitioning the pins into a plurality of pin groups, pins in a pin group being compatible with other pins in the same group under prescribed criteria;

(b) for a first pin group of the plurality of pin groups, steps for generating at least one possible bank solution, a bank solution identifying one or more banks that can accommodate all the pins in the first group without violating the prescribed criteria;

(c) for a first solution of the at least one possible bank solution, steps for placing pins of the first pin group in the one or more banks identified by the first bank solution consistent with a maximum window current restriction; and (d) steps for repeating (b) and (c) for respective other groups of the plurality of pin groups.

22. The method of claim 21 wherein placing comprises:

(i) steps for calculating a maximum window current for each available pad in a bank of the one or more banks of one of the bank solutions;

(ii) steps for identifying a pad p having the lowest maximum window current if only one pad has the lowest maximum window current;

(iii) steps for, if more than one pad has the lowest maximum window current, identifying a pad p of the pads having the lowest maximum window current that is positioned closest to a first end of the pad p's I/O bank;

(iv) steps for calculating a maximum window current for the pad p (MWCp) assuming a pin n from a pin group presently being placed is placed at pad p;

(v) steps for designating pin n as placed in pad p if MWCp is not greater than a window current limit corresponding to pad p's I/O bank; and (vi) if pins remains remain unplaced in the pin group presently being placed, repeating (i)–(v).

* * * * *